(12) United States Patent
Matsumoto

(10) Patent No.: US 8,144,046 B2
(45) Date of Patent: Mar. 27, 2012

(54) LINEARITY ENHANCEMENT CIRCUIT, ΣΔ A/D CONVERTER, AND RECEPTION APPARATUS

(75) Inventor: Tomohiro Matsumoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 45 days.

(21) Appl. No.: 12/805,161

(22) Filed: Jul. 15, 2010

(65) Prior Publication Data

US 2011/0025534 A1 Feb. 3, 2011

(30) Foreign Application Priority Data

Jul. 30, 2009 (JP) ................................ 2009-177477

(51) Int. Cl.
*H03M 1/12* (2006.01)

(52) U.S. Cl. ........ 341/155; 341/143; 341/144; 341/110; 341/156

(58) Field of Classification Search ................... 341/144, 341/155, 156, 110, 131, 143
See application file for complete search history.

(56) References Cited

U.S. PATENT DOCUMENTS

| | | | | |
|---|---|---|---|---|
| 4,380,006 A * | 4/1983 | Borisov et al. | ................. | 341/118 |
| 5,028,926 A * | 7/1991 | Tokuhiro | ..................... | 341/161 |
| 5,694,435 A * | 12/1997 | Kolle et al. | ..................... | 375/342 |
| 5,786,779 A * | 7/1998 | Chun et al. | ..................... | 341/61 |
| 6,486,806 B1 * | 11/2002 | Munoz et al. | ................. | 341/120 |
| 6,556,158 B2 * | 4/2003 | Steensgaard-Madsen | .... | 341/131 |
| 7,015,853 B1 * | 3/2006 | Wolff et al. | ..................... | 341/155 |
| 7,142,606 B2 * | 11/2006 | Talwalkar et al. | ............ | 375/259 |
| 7,176,817 B2 * | 2/2007 | Jensen | .......................... | 341/131 |
| 2002/0041247 A1 * | 4/2002 | Steensgaard-Madsen | .... | 341/156 |

FOREIGN PATENT DOCUMENTS

JP 2006-262488 9/2006

OTHER PUBLICATIONS

R. T. Baird et al., "Linearity Enhancement of Multibit ΣΔ A/D and D/A Converters Using Data Weighted Averaging," IEEE Transactions on Circuits and Systems-II: Analog and Digital Signal Processing, vol. 42, No. 12, pp. 753-762, Dec. 1995.

S. Pavan et al., "A Power Optimized Continuous-Time ΣΔ ADC for Audio Applications," IEEE Journal of Solid-State Circuits, vol. 43, No. 2, pp. 351-360, Feb. 2008.

J. Arias et al., "A 32-mW 320-MHz Continuous-Time Complex Delta-Sigma ADC for Multi-Mode Wireless-LAN Receivers," IEEE Journal of Solid-State Circuits, vol. 41, No. 2, pp. 339-351, Feb. 2006.

* cited by examiner

*Primary Examiner* — Jean B Jeanglaude
(74) *Attorney, Agent, or Firm* — Rader, Fishman & Grauer PLLC

(57) ABSTRACT

A linearity enhancement circuit is disclosed which includes: a first shift amount creation block creating a first shift amount in keeping with the immediately preceding output code of an n-bit A/D converter; a first shifter circuit bit-shifting input code data by the first shift amount that has been supplied, the first shifter circuit further outputting the bit-shifted input code data; a register storing the output of the first shifter circuit in order to output the stored data as the input code data to the first shifter circuit thereby forming a loop circuit in conjunction with the first shifter circuit, the register further outputting the stored code data as a second shift amount; and a second shifter circuit bit-shifting the output code of the A/D converter by the second shift amount that has been supplied, the second shifter circuit further outputting the bit-shifted output code to an n-bit D/A converter.

8 Claims, 14 Drawing Sheets

| TIME | THERMOMETER CODE (A/D OUTPUT) | THERMOMETER CODE (PAST SHIFTER) |
|---|---|---|
| 0 | 0000111 | 0000111 |
| TCLK | 0001111 | 1111000 |
| 2TCLK | 0000011 | 0000011 |

FIG.6
| REGISTER 1 OUTPUT (A/D CONVERTER OUTPUT GIVEN 1 CLOCK EARLIER) | | LOGIC 1 OUTPUT (BIT SHIFT AMOUNT) |
|:---:|:---:|:---:|
| 0 | → | 0 |
| 1 | → | 1 |
| 2 | → | 2 |
| 3 | → | 3 |
| 4 | → | 4 |
| 5 | → | 5 |
| 6 | → | 6 |
| 7 | → | 0 |
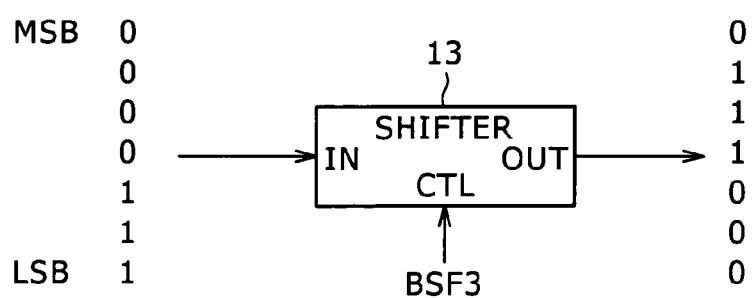
FIG.7A
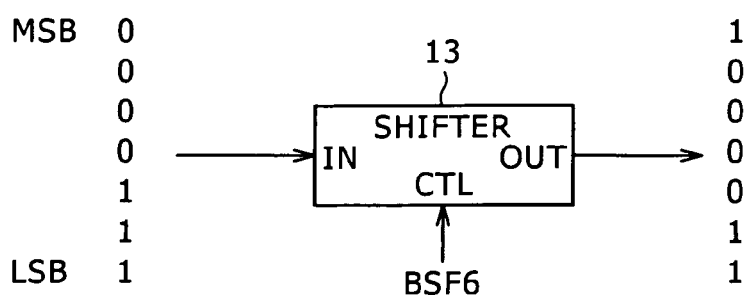
FIG.7B

FIG. 9

| | MSB | 0 | 0 | 0 | 0 | 0 | 0 | 1 |
|---|---|---|---|---|---|---|---|---|
| | | 0 | 0 | 0 | 0 | 0 | 1 | 0 |
| RESULTS OF | | 0 | 0 | 0 | 0 | 1 | 0 | 0 |
| REGISTER 2 | | 0 | 0 | 0 | 1 | 0 | 0 | 0 |
| OUTPUT | | 0 | 0 | 1 | 0 | 0 | 0 | 0 |
| | | 0 | 1 | 0 | 0 | 0 | 0 | 0 |
| | LSB | 1 | 0 | 0 | 0 | 0 | 0 | 0 |
| | | ↓ | ↓ | ↓ | ↓ | ↓ | ↓ | ↓ |
| LOGIC 2 OUTPUT (DECIMAL NUMBERS) | | 0 | 1 | 2 | 3 | 4 | 5 | 6 |

FIG. 10

| | MSB | 0 | 0 | 1 | 0 | 0 |
|---|---|---|---|---|---|---|
| | | 0 | 0 | 1 | 0 | 1 |
| 3-BIT D/A CONVERTER | | 0 | 0 | 1 | 1 | 0 |
| INPUT | | 0 → | 0 → | 1 → | 1 → | 0 |
| (SHIFTER 2 OUTPUT) | | 0 | 1 | 0 | 1 | 0 |
| | | 0 | 1 | 0 | 1 | 0 |
| | LSB | 0 | 1 | 1 | 0 | 0 |

LOGIC 2 OUTPUT      0 → 0 → 3 → 1 → 5

| | MSB | 0 | 0 | 0 | 0 | 0 |
|---|---|---|---|---|---|---|
| | | 0 | 0 | 0 | 0 | 0 |
| 3-BIT A/D CONVERTER | | 0 | 0 | 1 | 0 | 0 |
| OUTPUT | | 0 → | 0 → | 1 → | 1 → | 0 |
| (SHIFTER 2 INPUT) | | 0 | 1 | 1 | 1 | 0 |
| | | 0 | 1 | 1 | 1 | 0 |
| | LSB | 0 | 1 | 1 | 1 | 1 |

FIG.15

| | | | | | | | | | |
|---|---|---|---|---|---|---|---|---|---|
| THERTER CODE (LOGIC INPUT) | MSB | 0 | 0 | 0 | 0 | 0 | 0 | 0 | 1 |
| | | 0 | 0 | 0 | 0 | 0 | 0 | 1 | 1 |
| | | 0 | 0 | 0 | 0 | 0 | 1 | 1 | 1 |
| | | 0 | 0 | 0 | 0 | 1 | 1 | 1 | 1 |
| | | 0 | 0 | 0 | 1 | 1 | 1 | 1 | 1 |
| | | 0 | 0 | 1 | 1 | 1 | 1 | 1 | 1 |
| | LSB | 0 | 1 | 1 | 1 | 1 | 1 | 1 | 1 |
| | | ↓ | ↓ | ↓ | ↓ | ↓ | ↓ | ↓ | ↓ |
| LOGIC OUTPUT | MSB | 0 | 0 | 0 | 0 | 0 | 0 | 1 | 0 |
| | | 0 | 0 | 0 | 0 | 0 | 1 | 0 | 0 |
| | | 0 | 0 | 0 | 0 | 1 | 0 | 0 | 0 |
| | | 0 | 0 | 0 | 1 | 0 | 0 | 0 | 0 |
| | | 0 | 0 | 1 | 0 | 0 | 0 | 0 | 0 |
| | | 0 | 1 | 0 | 0 | 0 | 0 | 0 | 0 |
| | LSB | 1 | 0 | 0 | 0 | 0 | 0 | 0 | 1 |

LINEARITY ENHANCEMENT CIRCUIT, ΣΔ A/D CONVERTER, AND RECEPTION APPARATUS

BACKGROUND OF THE INVENTION

1. Field of the Invention

The present invention relates to a linearity enhancement circuit of a digital/analog (D/A) converter, a ΣΔ A/D converter, and a reception apparatus. More particularly, the invention relates to a linearity enhancement circuit used by an A/D converter and a D/A converter involving the use of ΣΔ modulation, such as a feedback D/A converter inside a ΣΔ A/D converter and a ΣΔ D/A converter.

2. Description of the Related Art

FIG. 1 is a block diagram showing a basic structure of a ΣΔ A/D converter. The ΣΔ A/D converter 1 is made up of a filter block 2, an A/D converter 3 with low resolution (of 1 to 5 bits), a D/A converter 4 having the same bit count as the A/D converter 3, and a subtractor 5 at the input stage. Because the ΣΔ A/D converter is a feedback-based system, the nonlinearity and noise of the circuit are reduced and high resolution is implemented thereby.

However, the closer the components of the ΣΔ A/D converter to the analog input side, the more difficult for these components to reduce the nonlinearity and noise of the circuit. For this reason, the input circuit of the filter block 2 and the D/A converter 4 are required to possess enhanced linearity and low-noise characteristics. Because the nonlinearity of the D/A converter 4 tends to raise the nose floor, it is important to guarantee the linearity of the D/A converter especially if the A/D converter in use is other than a one-bit A/D converter.

As one way to improve the linearity of the multi-bit D/A converter, there exists the technique known as data weighted averaging (called DWA hereunder) disclosed in "Linearity Enhancement of Multibit ΣΔ A/D and D/A Converters Using Data Weighted Averaging," by Rex T. Baird and Terri S. Fiez, IEEE TRANSACTIONS ON CIRCUITS AND SYSTEMS-II: ANALOG AND DIGITAL SIGNAL PROCESSING VOL. 42, NO. 12, December 1995.

FIGS. 2A and 2B are schematic views showing how a D/A converter operates without DWA and using DWA, respectively. FIGS. 2A and 2B each illustrate a three-bit D/A converter composed of seven current sources I1 through I7. Where DWA is not used, as in the case of FIG. 2A, the current sources are always used successively from left to right (i.e., starting from LSB (least significant bit)) based on DAC code. On the other hand, where DWA is used as indicated in FIG. 2B, the current source about to be used is always different from the one used immediately precedingly. Resorting to DWA makes it possible to shift the noise stemming from current source dispersion (i.e., nonlinearity) out of band to higher frequencies.

FIG. 3 is a schematic view showing a typical structure of an ordinary linearity enhancement circuit 6 of a D/A converter adopting the DWA scheme. The linearity enhancement circuit 6 has an A/D converter 7 disposed on its input side and a D/A converter 8 on its output side. FIG. 3 shows a case involving the use of a three-bit A/D converter 7 that is a flash type with thermometer code used as its output code.

The linearity enhancement circuit 6 is made up of a conversion circuit 61 for converting thermometer code into binary code, an adder 62, flip-flop circuits 63 and 64, and a shifter circuit 65 for bit-shifting thermometer code. In the linearity enhancement circuit 6, the code bit-shifted by the shifter circuit 65 is always rotated as shown in FIG. 4. The rotated code causes the D/A converter 8 to act in a manner implementing the workings of FIG. 2B.

Typical structures of the circuit in FIG. 3 are described illustratively in Japanese Patent Laid-Open No. 2006-262488 (U.S. Pat. No. 4,195,040; called Patent Document 1 hereunder); in "A 32-mW 320-MHz Continuous-Time Complex Delta-Sigma ADC for Multi-Mode Wireless LAN Receivers," IEEE JOURNAL OF SOLID-STATE CIRCUITS, VOL. 41, NO. 2, February 2006 (called Non-Patent Document 1 hereunder); and in "A Power Optimized Continuous-Time ΔΣ ADC for Audio Applications," IEEE JOURNAL OF SOLID-STATE CIRCUITS, VOL. 43, NO. 2, February 2008 (called Non-Patent Document 2 hereunder).

SUMMARY OF THE INVENTION

The structure depicted in the above-cited Patent Document 1 utilizes two full adders serially connected to implement DWA. This structure tends to have a very large latency of the carry signal path and risks interfering with high-speed performance.

The same holds for the structures described in Non-Patent Documents 1 and 2. The adders inside are liable to impede the effort to reduce power dissipation. Generally, the larger the number of bits used by the adder, the greater the delay of its carry signal path. This hampers high-speed performance and tends to increase power consumption because of the larger scale of circuitry involved.

The higher the operation clock frequency and the larger the number of bits of its internal A/D converter (1 to 5 bits), the higher the resolution attained by the ΣΔ A/D converter. Hence the need for a DWA structure that permits operation at higher speed and consumes less power without getting adders to operate in binary code.

The present invention has been made in view of the above circumstances and provides a linearity enhancement circuit for use by a D/A converter, a ΣΔ A/D converter, and a reception apparatus each operating at high speed on reduced power without getting adders to operate in binary code.

In carrying out the present invention and according to one embodiment thereof, there is provided a linearity enhancement circuit including: a first shift amount creation block configured to create a first shift amount in keeping with the immediately preceding output code of an n-bit analog/digital (A/D) converter; a first shifter circuit configured to bit-shift input code data by the first shift amount that has been supplied, the first shifter circuit further outputting the bit-shifted input code data; a register configured to store the output of the first shifter circuit in order to output the stored data as the input code data to the first shifter circuit thereby forming a loop circuit in conjunction with the first shifter circuit, the register further outputting the stored code data as a second shift amount; and a second shifter circuit configured to bit-shift the output code of the A/D converter by the second shift amount that has been supplied, the second shifter circuit further outputting the bit-shifted output code to an n-bit digital/analog (D/A) converter.

According to another embodiment of the present invention, there is provided a ΣΔ analog/digital converter including: a filter block configured to filter a supplied analog signal; an n-bit analog/digital (A/D) converter configured to convert the output signal of the filter block to a digital signal; an n-bit digital/analog (D/A) converter configured to convert the digital signal to an analog signal in a feedback loop of the A/D converter; a linearity enhancement circuit configured to be connected interposingly between the output of the A/D converter and the input of the D/A converter in the feedback loop, the linearity enhancement circuit further enhancing the linearity of the D/A converter; and a subtractor configured to subtract the output signal of the D/A converter from an input analog signal, the subtractor further supplying the resulting analog signal to the filter block. The linearity enhancement circuit includes: a first shift amount creation block configured to create a first shift amount in keeping with the immediately preceding output code of the A/D converter; a first shifter circuit configured to bit-shift input code data by the first shift amount that has been supplied, the first shifter circuit further outputting the bit-shifted input code data; a register configured to store the output of the first shifter circuit in order to output the stored data as the input code data to the first shifter circuit thereby forming a loop circuit in conjunction with the first shifter circuit, the register further outputting the stored code data as a second shift amount; and a second shifter circuit configured to bit-shift the output code of the A/D converter by the second shift amount that has been supplied, the second shifter circuit further outputting the bit-shifted output code to the D/A converter.

According to a further embodiment of the present invention, there is provided a reception apparatus including: a front end block configured to extract a received signal; a ΣΔ analog/digital (A/D) converter configured to convert to a digital signal the signal in analog form coming from the front end block; and a demodulation block configured to demodulate the output digital signal from the ΣΔ A/D converter. The ΣΔ A/D converter includes: a filter block configured to filter a supplied analog signal; an n-bit analog/digital (A/D) converter configured to convert the output signal of the filter block to a digital signal; an n-bit digital/analog (D/A) converter configured to convert the digital signal to an analog signal in a feedback loop of the A/D converter; a linearity enhancement circuit configured to be connected interposingly between the output of the A/D converter and the input of the D/A converter in the feedback loop, the linearity enhancement circuit further enhancing the linearity of the D/A converter; and a subtractor configured to subtract the output signal of the D/A converter from an input analog signal, the subtractor further supplying the resulting analog signal to the filter block. The linearity enhancement circuit includes: a first shift amount creation block configured to create a first shift amount in keeping with the immediately preceding output code of the A/D converter; a first shifter circuit configured to bit-shift input code data by the first shift amount that has been supplied, the first shifter circuit further outputting the bit-shifted input code data; a register configured to store the output of the first shifter circuit in order to output the stored data as the input code data to the first shifter circuit thereby forming a loop circuit in conjunction with the first shifter circuit, the register further outputting the stored code data as a second shift amount; and a second shifter circuit configured to bit-shift the output code of the A/D converter by the second shift amount that has been supplied, the second shifter circuit further outputting the bit-shifted output code to the D/A converter.

According to the embodiments of the present invention embodied as outlined above, it is possible to implement high-speed conversion performance at low power consumption with no need for adders computing in binary code.

BRIEF DESCRIPTION OF THE DRAWINGS

FIG. 6 is a schematic view showing relations of correspondence between the output of a first register and the output of a first logic block as a bit shift amount in the first embodiment;

FIGS. 7A and 7B are schematic views explanatory of the function of a shifter circuit in the first embodiment;

FIG. 9 is a schematic view explanatory of the function of a second logic block in the first embodiment;

FIG. 10 is a schematic view explanatory of the function of a second shifter circuit in the first embodiment;

FIG. 15 is a schematic view showing relations of correspondence between the output of an A/D converter (first register) and a shift signal as the output of a first logic block in the second embodiment;

DETAILED DESCRIPTION OF THE PREFERRED EMBODIMENTS

The preferred embodiments of the present invention will now be described in reference to the accompanying drawings. The description will be given under the following headings:

1. First embodiment (first typical structure of the linearity enhancement circuit);
2. Second embodiment (second typical structure of the linearity enhancement circuit);
3. Third embodiment (typical structure of the ΣΔ A/D converter); and
4. Fourth embodiment (typical structure of the reception apparatus).

1. First Embodiment

Figure 1:
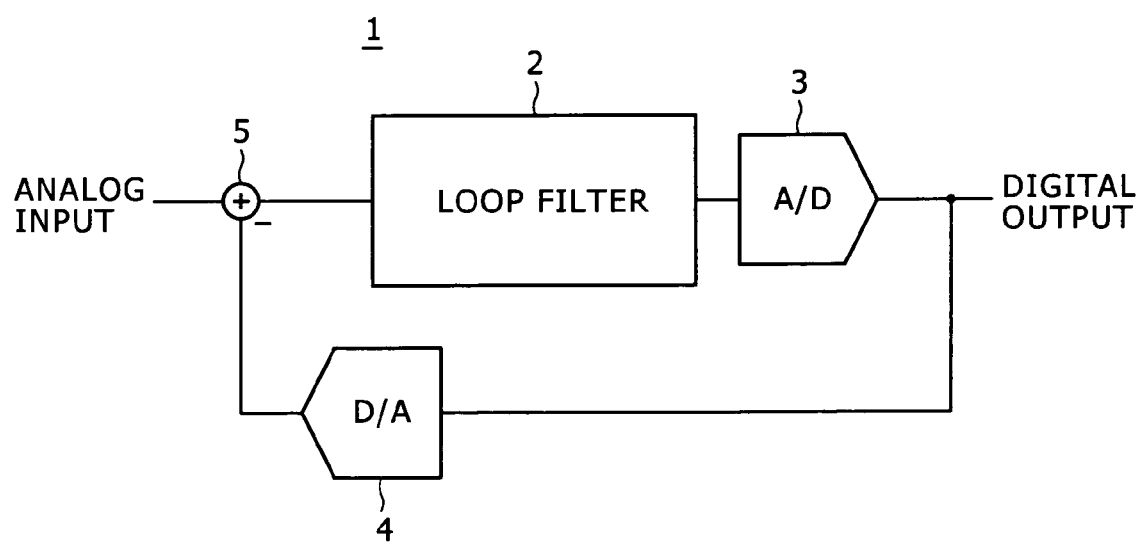
FIG. 1 is a block diagram showing a basic structure of a ΣΔ A/D converter.
Figure 2A:
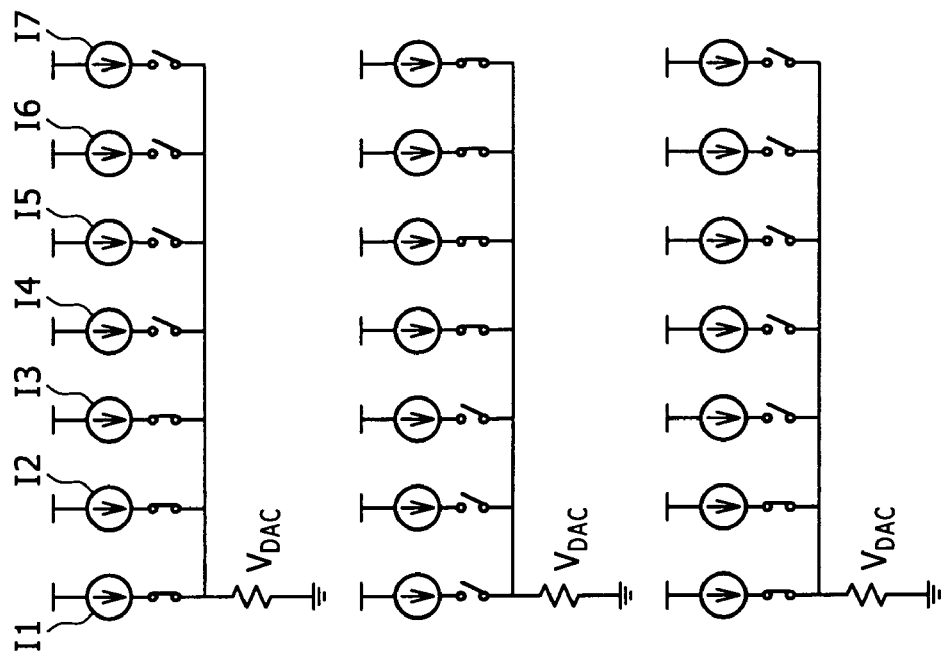
FIGS. 2A and 2B are schematic views showing how a D/A converter operates without DWA and using DWA, respectively.
Figure 2B:
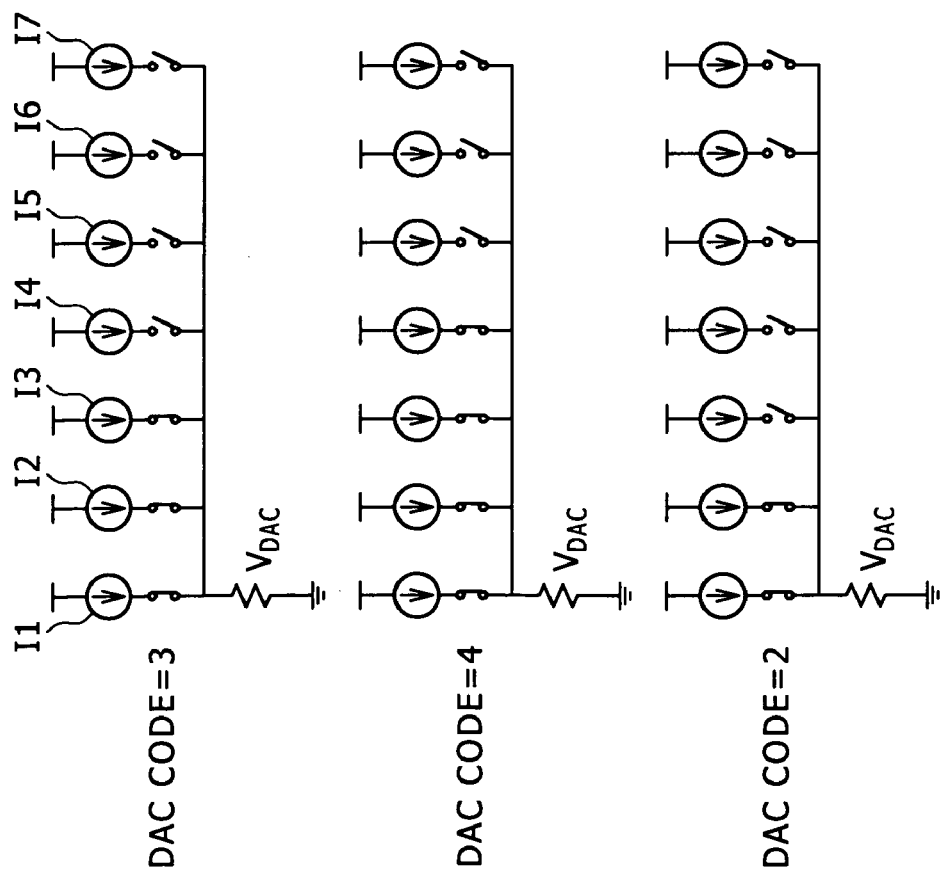
Figures 3, 4:
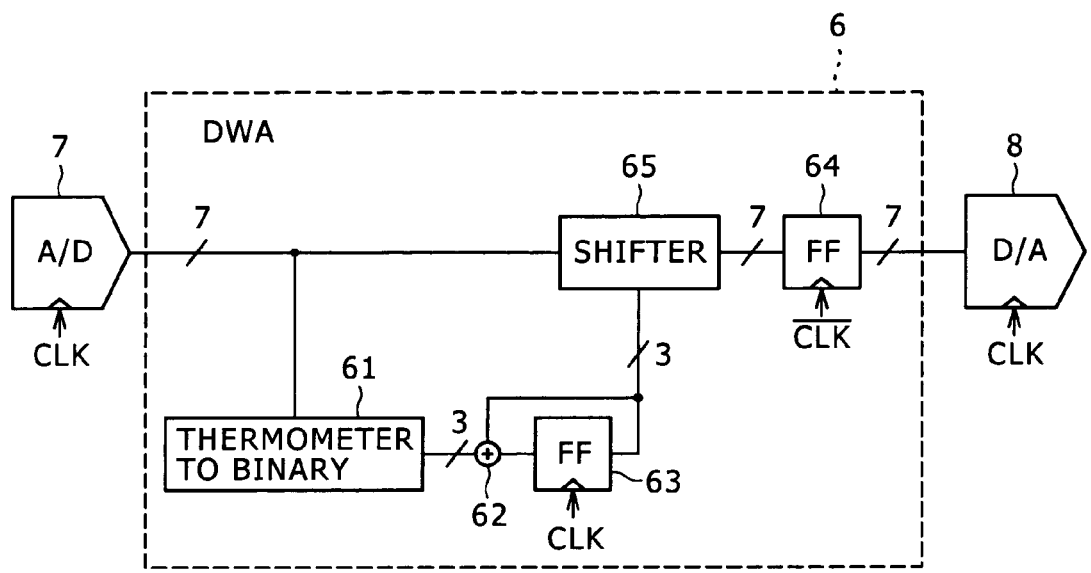
FIG. 3 is a schematic view showing a typical structure of an ordinary linearity enhancement circuit of a D/A converter adopting the DWA scheme.
FIG. 4 is a schematic view showing typical changing states of thermometer code.
Figure 5:
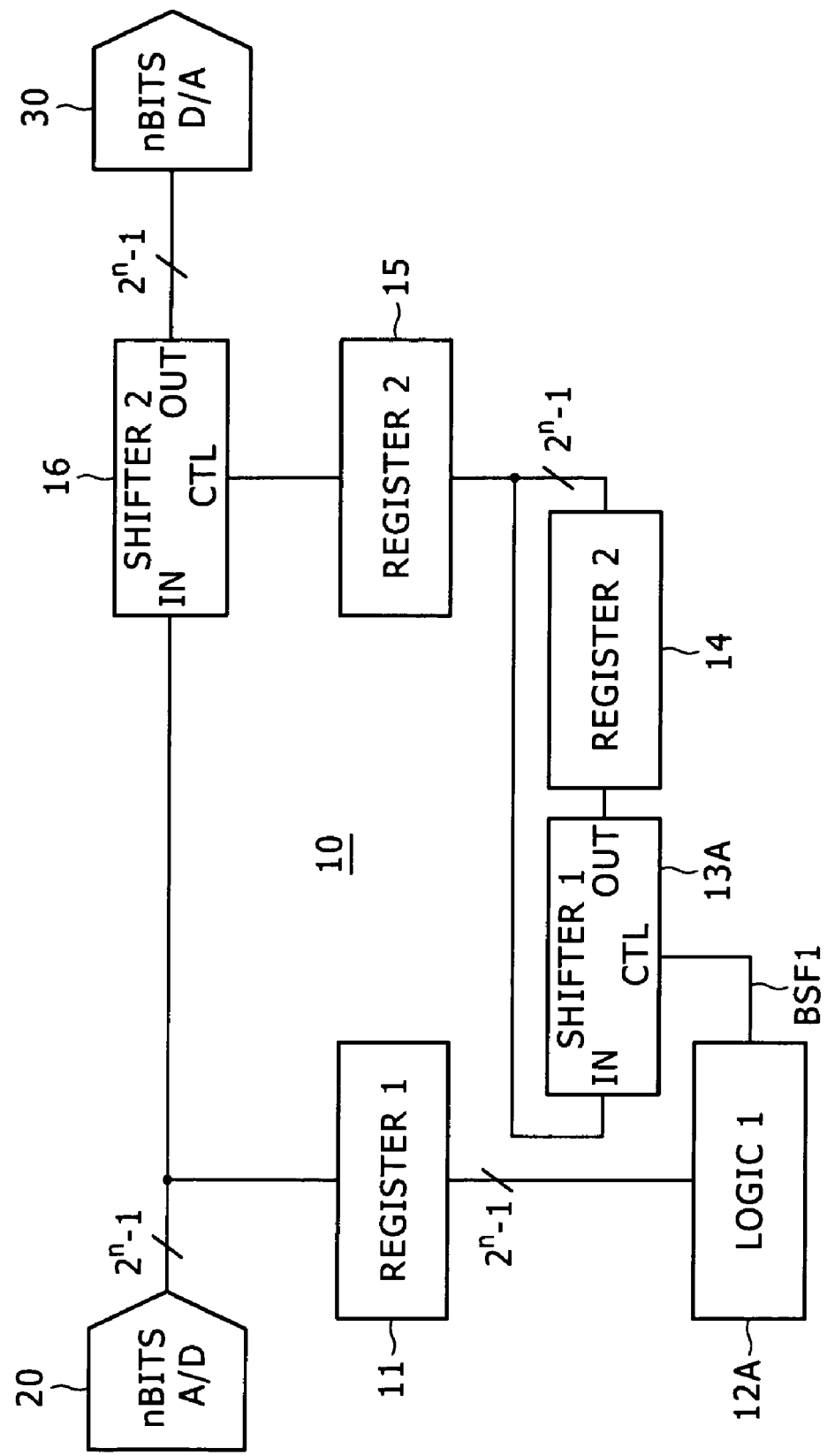
FIG. 5 is a block diagram showing a typical structure of a linearity enhancement circuit of a D/A converter implemented as a first embodiment of the present invention adopting the DWA scheme.

FIG. 5 shows a typical structure of a linearity enhancement circuit 10 of a D/A converter implemented as the first embodiment of the present invention adopting the DWA scheme. The linearity enhancement circuit 10 as the first embodiment has an n-bit A/D converter 20 disposed on the input side and an n-bit D/A converter 30 on the output side.

FIG. 5 shows a case in which the n-bit A/D converter 20 is used. The output of the n-bit A/D converter 20 is illustratively the thermometer code of ($2^n-1$) bits. For example, the output of a three-bit A/D converter is seven bits. The thermometer code is a code representing values by the number of "1" bits.

The linearity enhancement circuit 10 is structured to include a first register 11, a first logic block 12 acting as a first shift amount creation block, a first shifter circuit 13, a second register 14, a second logic block 5 acting as a second shift amount creation block, and a second shifter circuit 16. The first register 11 stores the output code of ($2^n-1$) bits from the A/D converter 20 given one clock earlier (at the immediately preceding clock). The first logic block 12 functions as the first shift amount creation block. The first logic block 12 converts the output code of the A/D converter 20 stored in the first register 11 into a bit shift amount BSF (first shift amount) for the first shifter circuit 13, and outputs the resulting bit shift amount to the first shifter circuit 13.

FIG. 6 shows relations of correspondence between the output of a first register and the output of a first logic block as a bit shift amount in the first embodiment. Specifically, FIG. 6 indicates the decoder output in effect where a three-bit A/D converter is used. For purpose of simplification and illustration, the example here is one in which the output of the A/D converter 20 is converted into thermometer code and the output of the first logic block 12 into decimal numbers. In the example of FIG. 6, the first logic block 12 sets the bit shift amount BSF to "0" only when the output of the A/D converter 20 is maximum; otherwise the first logic block 12 converts the output value of the A/D converter 20 as is into the bit shift amount BSF.

The first shifter circuit 13 is a two-input, one-output circuit. In keeping with the bit shift amount BSF input to its control terminal CTL by the first logic block 12, the first shifter circuit 13 shifts the bit sequence input to its input terminal "in." The first shifter circuit 13 proceeds to output the shifted bit sequence via its output terminal "out" to the second register 14. The output code (stored code) of the second register 14 is input to the input terminal "in" of the first shifter circuit 13.

FIGS. 7A and 7B are schematic views explanatory of the function of a shifter circuit in the first embodiment. Whereas the explanation hereunder pertains to the function of the first shifter circuit 13, the second shifter circuit 16 also has the equivalent function.

In the example of FIG. 7A, the first shifter circuit 13 has a bit shift amount BSF of 3 input to its control terminal CTL. The first shifter circuit 13 shifts the code data (bit sequence) of "2'b0000111" fed to its input terminal "in" by 3 bits in the direction of MSB (most significant bit). As a result, the code data (bit sequence) of "2'b0111000" shifted by 3 bits is output from the output terminal "out" of the first shifter circuit 13.

In the example of FIG. 7B, the first shifter circuit 13 has a bit shift amount BSF of 6 input to its control terminal CTL. The first shifter circuit 13 shifts the code data (bit sequence) of "2'b0000111" fed to its input terminal "in" by 6 bits in the direction of MSB. If MSB is exceeded following the bit shift, LSB is again reached in cyclic fashion. As a result, the code data (bit sequence) of "1000011" shifted by 6 bits is output from the output terminal "out" of the first shifter circuit 13.

In the initial state, the second register 14 has only one bit set to "1" among its ($2^n-1$)-bit data. The second register 14 supplies the stored code data to the input terminal "in" of the first shifter circuit 13. The second register 14 stores the code data bit-shifted by the first shifter circuit 13, and sends the stored code data to the input terminal "in" of the first shifter circuit 13 and to the second logic block 15. In the output result of the second register 14, only one bit is always set to "1" out of the ($2^n-1$)-bit data.

Figure 8:
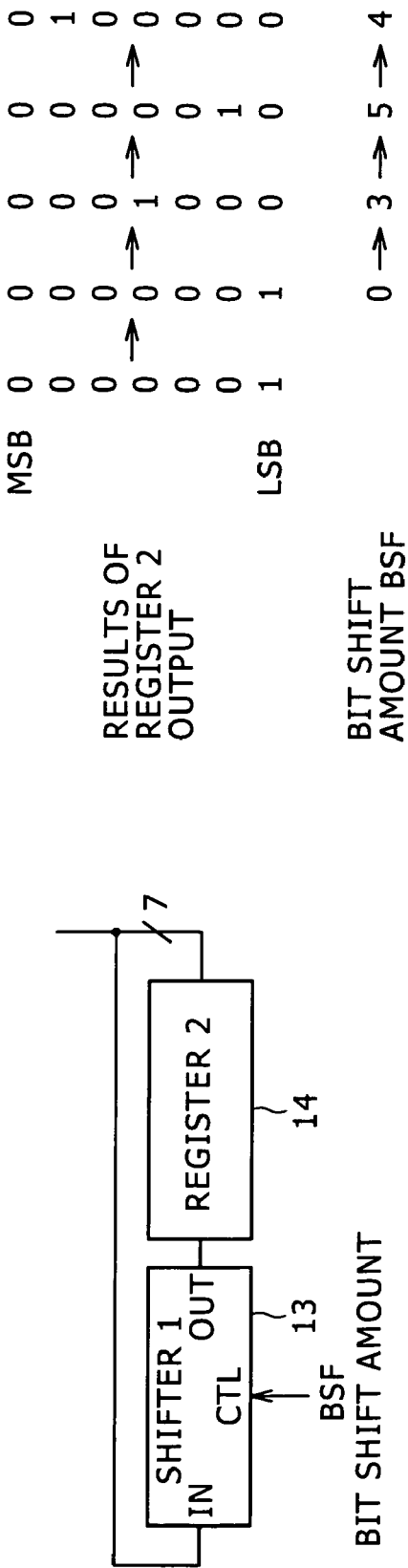
FIG. 8 is a schematic view explanatory of how a first shifter circuit and a second register circuit in the first embodiment operate in a manner constituting a loop circuit.

FIG. 8 is a schematic view explanatory of how the first shifter circuit 13 and the second register 14 in the first embodiment operate in a manner constituting a loop circuit. The loop circuit made up of the first shifter circuit 13 and second register 14 operates in keeping with the bit shift amount BSF output by the first logic block 12 as illustrated in FIG. 8. As discussed above, in the initial state, the second register 14 has only one bit of the stored data set to "1."

The example of FIG. 8 involves the use of a three-bit A/D converter and a three-bit D/A converter requiring $2^3-1=7$ bits each. In this case, "2'b0000001" is initially established. Regardless of the bit initially set to "1," the result is the same.

The "1" bit is shifted in accordance with the bit shift amount BSF supplied by the first logic block 12. The "1" bit is required to be shifted in reference to the immediately preceding state. That requirement necessitates implementing the loop structure shown in FIG. 8. If the position of the bit set to "1" is found to exceed MSB following the bit shift performed by the first shifter circuit 13, LSB is again reached in cyclic fashion.

In the example of FIG. 8, the output result of the second register 14 is obtained in keeping with the bit shift amount BSF. When the bit shift amount BSF is 0, no bit shift is effected by the first shifter circuit 13. In this case, the output of the second register 14 is "2'b0000001" which is the same as the initial state. When the bit shift amount BSF becomes 3, the first shifter circuit 13 effects a three-bit shift. This causes the second register 14 to output "2'b0001000" replacing the initial state of "2'b0000001." When the bit shift amount BSF becomes 5, the first shifter circuit 13 effects a five-bit shift which causes the second register 14 to output "2'b0000010" replacing the immediately preceding state of "2'b0001000." When the bit shift amount BSF becomes 4, the first shifter circuit 13 effects a four-bit shift which causes the second register 14 to output "2'b0100000" replacing the immediately preceding state of "2'b0000010." In this manner, only one bit is always set to "1" in the seven-bit data output by the second register 14.

The second logic block 15 functions as the second shift amount creation block of the invention. The second logic block 15 converts the output result of ($2^n-1$) bits from the second register 14 into a decimal number, and creates the converted data as the bit shift amount BSFT (first shift amount) of the second shifter circuit 16. The second logic block 15 proceeds to supply the created bit shift amount BSFT to the control terminal CTL of the second shifter circuit 16.

FIG. 9 is a schematic view explanatory of the function of the second logic block in the first embodiment. The example of FIG. 9 is one in which a three-bit A/D converter and a three-bit D/A converter are used. In the example of FIG. 9, the output result of the second register 14 is composed of 7 bits wherein only one bit is always set to "1." Thus the output result can be converted only into values ranging from 0 to 6.

If the output result of the second register 14 is "2'b0000001," the converted data output by the second logic block 15 is "0." If the output result of the second register 14 is "2'b0000010," the converted data output by the second logic block 15 is "1." If the output result of the second register 14 is "2'b0000100," the converted data output by the second logic block 15 is "2." If the output result of the second register 14 is "2'b0001000," the converted data output by the second logic block 15 is "3." If the output result of the second register 14 is "2'b0010000," the converted data output by the second logic block 15 is "4." If the output result of the second register 14 is "2'b0100000," the converted data output by the second logic block 15 is "5." If the output result of the second register 14 is "2'b1000000," the converted data output by the second logic block 15 is "6."

In general, where the n-bit A/D converter and n-bit D/A converter are employed, depending on the bit set to "1," the conversion takes place as follows: LSB→+0, LSB+1→1, LSB+2→2, . . . , MSB−1→$2^n$−3, and MSB→$2^n$−2.

The second shifter circuit 16 bit-shifts the thermometer code output by the A/D converter 20 in keeping with the bit shift amount output by the second logic block 15. The second shifter circuit 16 then feeds the bit-shifted data to the input of the D/A converter 30. The above-described functions combine to implement DWA.

FIG. 10 is a schematic view explanatory of the function of the second shifter circuit 16 in the first embodiment. FIG. 10 shows how the output of the A/D converter 20, the output of the second logic block 15, and the output of the second shifter circuit 16 (i.e., input of the D/A converter 30) illustratively relate to one another.

In this example, the output of the three-bit A/D converter 20, i.e., the input of the second shifter circuit 16, makes the following transition: "2'b0000000"→"2'b0000111"→"2'b0011111"→"2'b0001111"→"2'b0000001." In this case, the bit shift amount BSFT output by the second logic block 15 makes the following transition: "0"→"0"→"3"→"1"→"5." As a result, the input of the D/A converter 30, i.e., the output of the second shifter circuit 16, makes the following transition: "2'b0000000"→"2'b0000111"→"2'b1111001"→"2'b0011110"→"2'b0100000."

That is, when the input of the second shifter circuit 16 is "2'b0000000," the bit shift amount BSFT is "0," so that the second shifter circuit 16 does not perform any bit shift and outputs "2'b0000000," unmodified. When the input of the second shifter circuit 16 is "2'b0000111," the bit shift amount BSFT is still "0" so that the second shifter circuit 16 does not perform any bit shift and outputs "2'b0000111," unmodified. When the input of the second shifter circuit 16 is "2'b0011111," the bit shift amount BSFT is "3" so that the second shifter circuit 16 performs a three-bit shift and outputs the code "2'b1111001." When the input of the second shifter circuit 16 "2'b0001111," the bit shift amount BSFT is "1" so that the second shifter circuit 16 performs a one-bit shift from LSB and outputs the code "2'b0011110." When the input of the second shifter circuit 16 is "2'b0000001," the bit shift amount BSFT is "5" so that the second shifter circuit performs a one-bit shift from LSB and outputs the code "2'b0100000."

Figure 11:
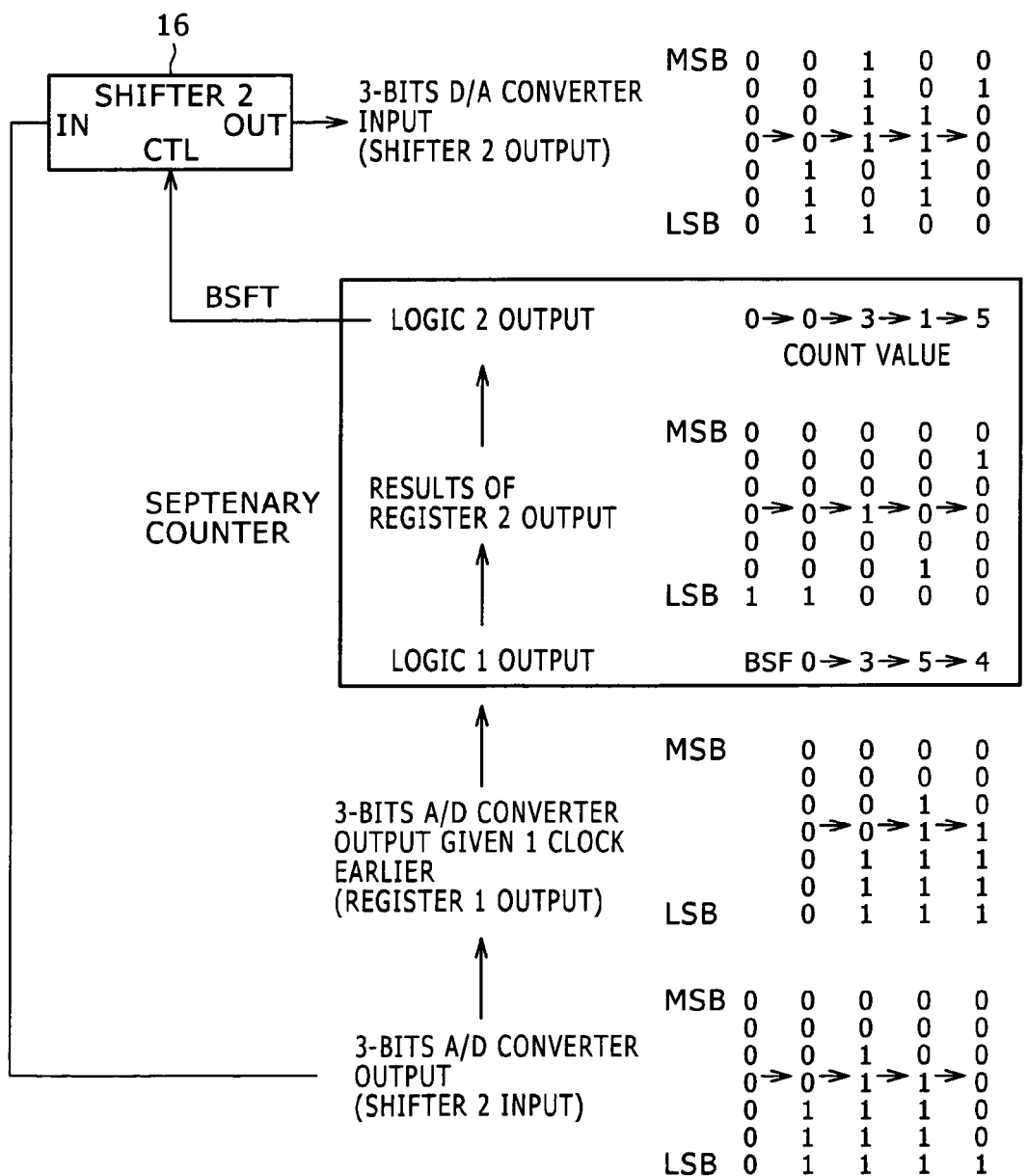
FIG. 11 is a schematic view explanatory of how the linearity enhancement circuit of the first embodiment operates.

FIG. 11 is a schematic view explanatory of how the linearity enhancement circuit of the first embodiment operates. The example of FIG. 11 summarizes the typical functional workings of the above-described three-bit A/D converter and three-bit D/A converter. In this case, the first shifter circuit 13 and second register 14 forming a loop require ($2^3$−1) bits each, so that a septenary counter (=$2^3$−1) is implemented. How the linearity enhancement circuit 10 of the first embodiment works is described below in reference to FIG. 11. Parts of the ensuing description may be redundant but are not omitted for descriptive clarity.

In this example, the output of the three-bit A/D converter 20 (i.e., input of the second shifter circuit 16) makes the following transition: "2'b0000000"→"2'b0000111"→"2'b0011111"→"2'b0001111"→"2'b0000001." The output code of the A/D converter 20 is fed to the input of the second shifter circuit 16, and the code given 1 clock earlier is placed into the first register 11. The code is stored into the first register 11 as "2'b0000000"→"2'b0000111"→"2'b0011111"→"2'b0001111," in that order, before being output to the first logic block 12.

In the first logic block 12, the bit shift amount BSF is set to "0" only when the output of the A/D converter 20 is maximum; otherwise the output value of the A/D converter 20 is converted unmodified into the bit shift amount BSF. Thus from the first logic block 12, the bit shift amount BSF is supplied to the control terminal CTL of the first shifter circuit 13 as "0"→"3"→"5"→"4," in that order.

In the loop circuit constituted by the first shifter circuit 13 and second register 14, the operations described below take place in accordance with the bit shift amount BSF output by the first logic block 12. In the initial state, the second register 14 has only one of its stored bits set to "1." In the example of FIG. 11, the three-bit A/D converter and three-bit D/A converter require $2^3$−1=7 bits each. Here, the initial state of "2'b0000001" is established.

When the bit shift amount BSF is 0, the first shifter circuit 13 does not perform any bit shift, so that the second register 14 outputs the same code "2'b0000001" as the initial state to the second logic block 15. When the bit shift amount BSF becomes 3, the first shifter circuit 13 performs a three-bit shift so that second register 14 outputs the code "2'b0001000" to the second logic block 15 following the bit shift from the initial state of "2'b0000001." When the bit shift amount BSF becomes 5, the first shifter circuit 13 performs a five-bit shift so that the second register 14 outputs the code "2'b0000010" to the second logic block 15 following the bit shift from the immediately preceding code "2'b0001000." When the bit shift amount BSF becomes 4, the first shifter circuit 13 performs a four-bit shift so that the second register 14 outputs the code "2'b0100000" to the second logic block 15 following the bit shift from the immediately preceding code "2'b0000010." As described above, only one bit is always set to "1" in the seven-bit data output by the second register 14.

In the second logic block 15, the seven-bit output result of the second register 14 is converted to decimal numbers. The converted data is created as the bit shift amount BSFT of the second shifter circuit 16. Although seven bits are output by the second register 14 in the second logic block 15, only one bit is always set to "1" among the seven bits. It follows that the output result is converted solely to values ranging from 0 to 6.

If the output result of the second register 14 is "2'b0000001," the converted data output by the second logic block 15 is "0" that is fed to the control terminal CTL of the second shifter circuit 16. If the output result of the second register 14 is "2'b0001000," the converted data output by the second logic block 15 is "3" that is then fed to the control terminal CTL of the second shifter circuit 16. If the output result of the second register 14 is "2'b0000010," the converted data output by the second logic block 15 is "1" that is supplied to the control terminal CTL of the second shifter circuit 16. If the output result of the second register 14 is "2'b0100000," the converted data output by the second logic block 15 is "5" that is sent to the control terminal CTL of the second shifter circuit 16.

In the second shifter circuit 16, the thermometer code output by the A/D converter 20 is bit-shifted in keeping with the bit shift amount output by the second logic block 15. The bit-shifted data is fed to the input of the D/A converter 30.

When the input of the second shifter circuit 16 is "2'b0000000," the bit shift amount BSFT is "0," so that the second shifter circuit 16 performs no bit shift and outputs "2'b0000000," unmodified. When the input of the second shifter circuit 16 is "2'b0000111," the bit shift amount BSFT is "0," so that the second shifter circuit 16 performs no bit shift and outputs "2'b0000111," unmodified. When the input of the second shifter circuit 16 is "2'b0011111," the bit shift amount BSFT is "3" so that the second shifter circuit 16 performs a three-bit shift from LSB and outputs the code "2'b1111001." When the input of the second shifter circuit 16 is "2'b0001111," the bit shift amount BSFT is "1" so that the second shifter circuit 16 performs a one-bit shift from LSB and outputs the code "2'b0011110." When the input of the second shifter circuit 16 is "2'b0000001," the bit shift amount BSFT is "5" so that the second shifter circuit 16 performs a five-bit shift from LSB and outputs the code "2'b0100000." The above-described functions combine to implement DWA.

According to the first embodiment, a counter without recourse to adders is implemented by combining the first logic block 12, the first shifter circuit 13 and second register 14 forming a loop, and the second logic block 15. Where the n-bit A/D converter and n-bit D/A converter are utilized, the first shifter circuit 13 and second register 14 constituting the loop require $(2^n-1)$ bits each. In this case, a $(2^n-1)$-based counter is implemented.

2. Second Embodiment

Figure 12:
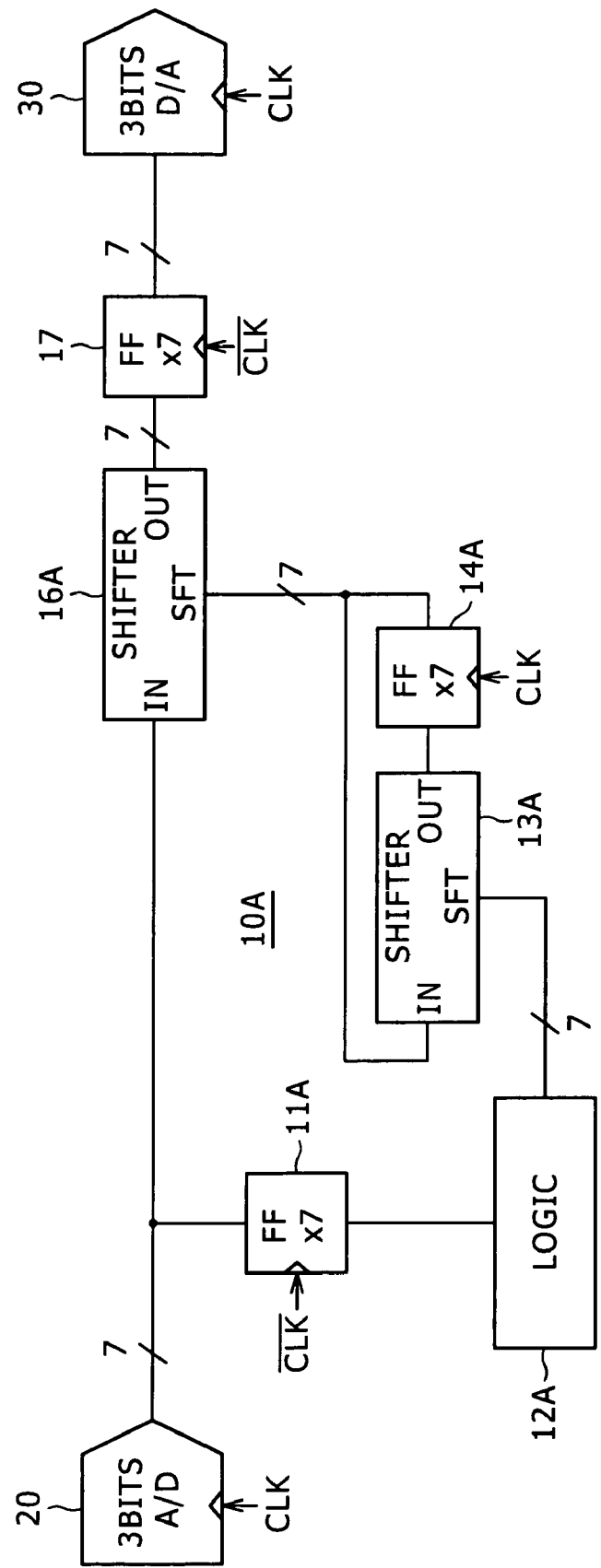
FIG. 12 is a block diagram showing a typical structure of a linearity enhancement circuit of a D/A converter implemented as a second embodiment of the present invention adopting the DWA scheme.

FIG. 12 is a block diagram showing a typical structure of a linearity enhancement circuit 10A of a D/A converter implemented as the second embodiment of the present invention adopting the DWA scheme. FIG. 12 shows an example in which a three-bit A/D converter and a three-bit D/A converter are used. The linearity enhancement circuit 10A of the second embodiment is different from the linearity enhancement circuit 10 of the first embodiment in the following points.

The linearity enhancement circuit 10A of the second embodiment does not have a second logic block. The first logic block of the second embodiment does not convert the thermometer code of $(2^n-1)$ bits (i.e., 7 bits in this example) to decimal numbers. Instead, the first logic block feeds the seven-bit code to the first shifter circuit 13A. In addition to the first register 11A and second register 14A, a third register 17 is disposed in the output stage of the second shifter circuit 16A. The first register 11A, second register 14A, and third register 17 are each composed of $(2^n-1)$ flip-flops FF (7 flip-flops in this example). The first shifter circuit 13A and second shifter circuit 16A are structured to perform shift operations upon receipt of seven-bit code data.

Figure 13:
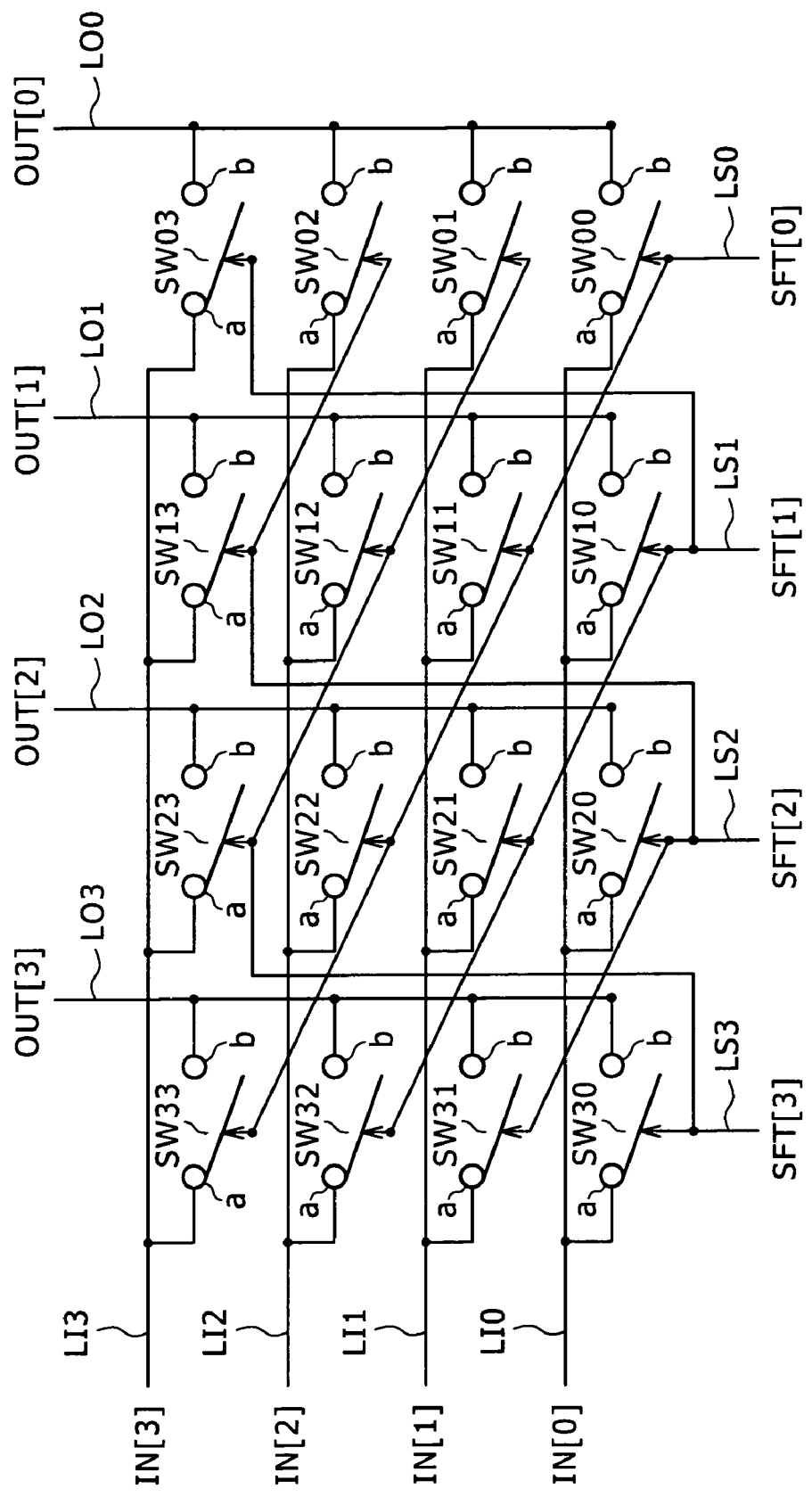
FIG. 13 is a circuit diagram showing a typical structure of a shifter circuit in the second embodiment.

Typical structures of the first shifter circuit 13A and second shifter circuit 16A will now be explained. FIG. 13 is a circuit diagram showing a typical structure of the shifter circuit in the second embodiment. Whereas the explanation hereunder pertains to the function of the first shifter circuit 13A, the second shifter circuit 16A also has the equivalent function. For purpose of simplification and illustration, the structure of this example is devised as a two-bit setup instead of the three-bit arrangement. However, the basic concept is the same regardless of the number of bits involved. Various structures may be adopted for the shifter circuit (e.g., see "A 100 mW 10 MHz-BW CTΔΣ Modulator with 87 dB DR and 91 dBc IMD Solid-State Circuits Conference, 2008. ISSCC2008. Digest of Technical Papers, IEEE international, Date: 3 to 7 Feb. 2008, Pages: 498-631").

The shifter circuit 13A is structured to include switches SW00 through SW03, SW10 through SW13, SW20 through SW23, SW30 through SW33, input lines LI0 through LI3, output lines LO0 through LO3, and shift control lines LS0 through LS3.

The input line LI0 is connected to an input terminal in[0] and to the terminals "a" of the switches SW00, SW10, SW20, and SW30.

The input line LI1 is connected to an input terminal in[1] and to the terminals "a" of the switches SW01, SW11, SW21, and SW31.

The input line LI2 is connected to an input terminal in[2] and to the terminals "a" of the switches SW02, SW12, SW22, and SW32.

The input line LI3 is connected to an input terminal in[3] and to the terminals "a" of the switches SW03, SW13, SW23, and SW33.

The output line LO0 is connected to an output terminal out[0] and to the terminals "b" of the switches SW00, SW01, SW02, and SW03.

The output line LO1 is connected to an output terminal out[1] and to the terminals "b" of the switches SW10, SW11, SW12, and SW13.

The output line LO2 is connected to an output terminal out[2] and to the terminals "b" of the switches SW20, SW21, SW22, and SW23.

The output line LO3 is connected to an output terminal out[3] and to the terminals "b" of the switches SW30, SW31, SW32, and SW33.

The shift control line LS0 is connected to a shift terminal SFT[0] and to the control terminals of the switches SW00, SW11, SW22, and SW33.

The shift control line LS1 is connected to a shift terminal SFT[1] and to the control terminals of the switches SW03, SW10, SW21, and SW32.

The shift control line LS2 is connected to a shift terminal SFT[2] and to the control terminals of the switches SW02, SW13, SW20, and SW31.

The shift control line LS3 is connected to a shift terminal SFT[3] and to the control terminals of the switches SW01, SW12, SW23, and SW30.

The switches SW00 through SW03, SW10 through SW13, SW20 through SW23, and SW30 through SW33 are turned on when a "1" is input to the shift control lines LS0 through LS3 with which the control terminals of the switches are connected. These switches are turned off when a "0" is input to the shift control lines LS0 through LS3. Of the $(2^n-1)$ bits constituting the shift signal supplied by the first logic block 12A, only one bit is set to "1"; the other bits are set to "0" each.

When a "1" is input to the shift terminal SFT[0], only the switches SW00, SW11, SW22, and SW33 are turned on. In this case, the bit signal input to the input terminal in[0] is output from the output terminal out[0] via the input line LI0, switch SW00, and output line LO0.

The bit signal input to the input terminal in[1] is output from the output terminal out[1] via the input line LI1, switch SW11, and output line LO1.

The bit signal input to the input terminal in[2] is output from the output terminal out[2] via the input line LI2, switch SW22, and output line LO2.

The bit signal input to the input terminal in[3] is output from the output terminal out[3] via the input line LI3, switch SW33, and output line LO3.

As described above, when a "1" is input to the shift terminal SFT[0], the input code is not bit-shifted but output unmodified.

When a "1" is input to the shift terminal SFT[1], only the switches SW03, SW10, SW21, and SW32 are turned on. In this case, the bit signal input to the input terminal in[0] is output from the output terminal out[1] via the input line LI0, switch SW10, and output line LO1.

The bit signal input to the input terminal in[1] is output from the output terminal out[2] via the input line LI1, switch SW21, and output line LO2.

The bit signal input to the input terminal in[2] is output from the output terminal out[3] via the input line LI2, switch SW32, and output line LO3.

The bit signal input to the input terminal in[3] is output from the output terminal out[0] via the input line LI3, switch SW03, and output line LO0.

As described above, when a "1" is input to the shift terminal SFT[1], the input code is shifted by 1 bit before being output.

When a "1" is input to the shift terminal SFT[2], only the switches SW02, SW13, SW20, and SW31 are turned on. In this case, the bit signal input to the input terminal in[0] is output from the output terminal out[2] via the input line LI0, switch SW20, and output line LO2.

The bit signal input to the input terminal in[1] is output from the output terminal out[3] via the input line LI1, switch SW31, and output line LO3.

The bit signal input to the input terminal in[2] is output from the output terminal out[0] via the input line LI2, switch SW02, and output line LO0.

The bit signal input to the input terminal in[3] is output from the output terminal out[1] via the input line LI3, switch SW13, and output line LO1.

As described above, when a "1" is input to the shift terminal SFT[2], the input code is shifted by 2 bits before being output.

When a "1" is input to the shift terminal SFT[3], only the switches SW01, SW12, SW23, and SW30 are turned on. In this case, the bit signal input to the input terminal in[0] is output from the output terminal out[3] via the input line LI0, switch SW30, and output line LO3.

The bit signal input to the input terminal in[1] is output from the output terminal out[0] via the input line LI1, switch SW01, and output line LO0.

The bit signal input to the input terminal in[2] is output from the output terminal out[1] via the input line LI2, switch SW12, and output line LO1.

The bit signal input to the input terminal in[3] is output from the output terminal out[2] via the input line LI3, switch SW23, and output line LO2.

As described above, when a "1" is input to the shift terminal SFT[3], the input code is shifted by 3 bits before being output.

What was described above are the structure and function of the two-bit shifter circuit. The same concept and the same structure as those of the two-bit setup also apply to the three-bit or ($2^n$–1)-bit setup, although the number of switches and other components involved may increase in such cases.

Figure 14A:
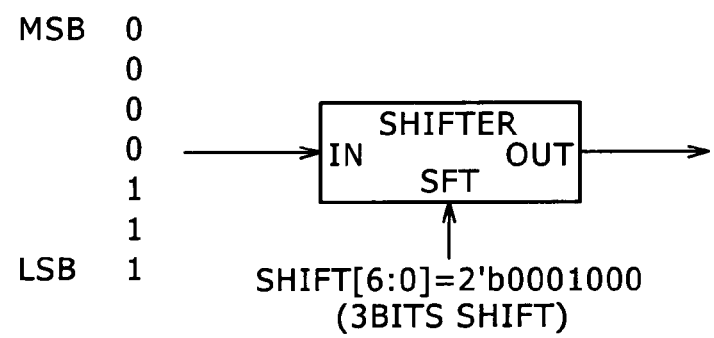
FIGS. 14A and 14B are schematic views explanatory of the function of the shifter circuit shown in FIG. 13.
Figure 14B:
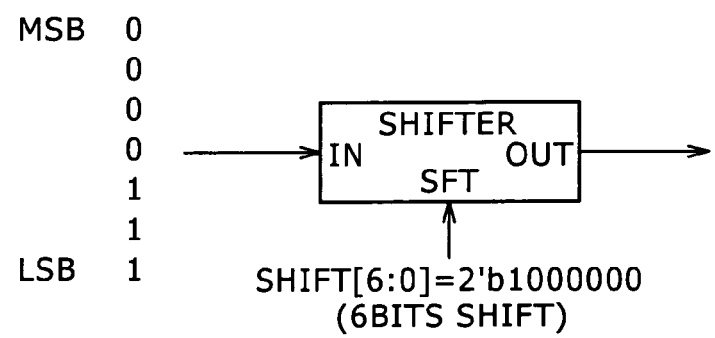

FIGS. 14A and 14B are schematic views explanatory of the function of the shifter circuit shown in FIG. 13. The first shifter circuit 13A controls the bit shift amount in a manner illustrated in FIGS. 14A and 14B.

When a shift signal shift[6:0] from the first logic block 12A is "2'b0001000," the first shifter circuit 13A performs a three-bit shift because "1" is set in the fourth bit from LSB (4-1). In the example of FIG. 14A, the code data (bit sequence) of "2'b0000111" fed to the input terminal "in" is shifted toward MSB by 3 bits. As a result of this, the code data (bit sequence) of "2'b0111000" subsequent to the three-bit shift is output from the output terminals out[0] through out[6] of the first shifter circuit 13A.

When the shift signal shift[6:0] from the first logic block 12A is "2'b1000000," the first shifter circuit 13A performs a six-bit shift because "1" is set in the seventh bit from LSB (7-1). In the example of FIG. 14B, the code data (bit sequence) of "2'b0000111" fed to the input terminal "in" is shifted toward MSB by 6 bits. As a result of this, the code data (bit sequence) of "2'1000011" subsequent to the six-bit shift is output from the output terminals out[0] through out[6] of the first shifter circuit 13A. The shift signal shift[6:0] is given on the assumption that only one bit in the code string is set to "1."

Because the first shifter circuit 13A possesses the structure and function described above, the first logic block 12A converts the thermometer code output by the A/D converter 20 in a manner depicted in FIG. 15. If all the bits making up the code are 0's or 1's, then the code is converted to the same code.

FIG. 15 is a schematic view showing relations of correspondence between the output of the A/D converter 20 (first register) and the shift signal as the output of the first logic block 12A in the second embodiment.

When the input seven-bit thermometer code is "2'b0000000," the first logic block 12A sets the shift signal shift[6:0] to "2'b0000001," and outputs the resulting shift signal to the shift terminal SFT of the first shifter circuit 13A.

When the input seven-bit thermometer code is "2'b0000001," the first logic block 12A sets the shift signal shift[6:0] to "2'b0000010," and outputs the resulting shift signal to the shift terminal SFT of the first shifter circuit 13A.

When the input seven-bit thermometer code is "2'b0000011," the first logic block 12A sets the shift signal shift[6:0] to "2'b0000100," and outputs the resulting shift signal to the shift terminal SFT of the first shifter circuit 13A.

When the input seven-bit thermometer code is "2'b0000111," the first logic block 12A sets the shift signal shift[6:0] to "2'b0001000," and outputs the resulting shift signal to the shift terminal SFT of the first shifter circuit 13A.

When the input seven-bit thermometer code is "2'b0001111," the first logic block 12A sets the shift signal shift[6:0] to "2'b0010000," and outputs the resulting shift signal to the shift terminal SFT of the first shifter circuit 13A.

When the input seven-bit thermometer code is "2'b0011111," the first logic block 12A sets the shift signal shift[6:0] to "2'b0100000," and outputs the resulting shift signal to the shift terminal SFT of the first shifter circuit 13A.

When the input seven-bit thermometer code is "2'b0111111," the first logic block 12A sets the shift signal shift[6:0] to "2'b1000000," and outputs the resulting shift signal to the shift terminal SFT of the first shifter circuit 13A.

When the input seven-bit thermometer code is "2'b1111111," the first logic block 12A sets the shift signal shift[6:0] to "2'b0000001," and outputs the resulting shift signal to the shift terminal SFT of the first shifter circuit 13A.

Where the shifter circuit of the second embodiment is adopted, there is no need for the second logic block 15 connected interposingly between the first shifter circuit 13 and the second shifter circuit 16 of the first embodiment. The reason for removal of the second logic block is that only one bit is set to "1" in the code circulating through the loop circuit composed of the first shifter circuit 13 and second register 14 and that when this code is used unmodified by the shifter circuit of FIG. 13, the relevant operation can be acquired.

Figure 16:
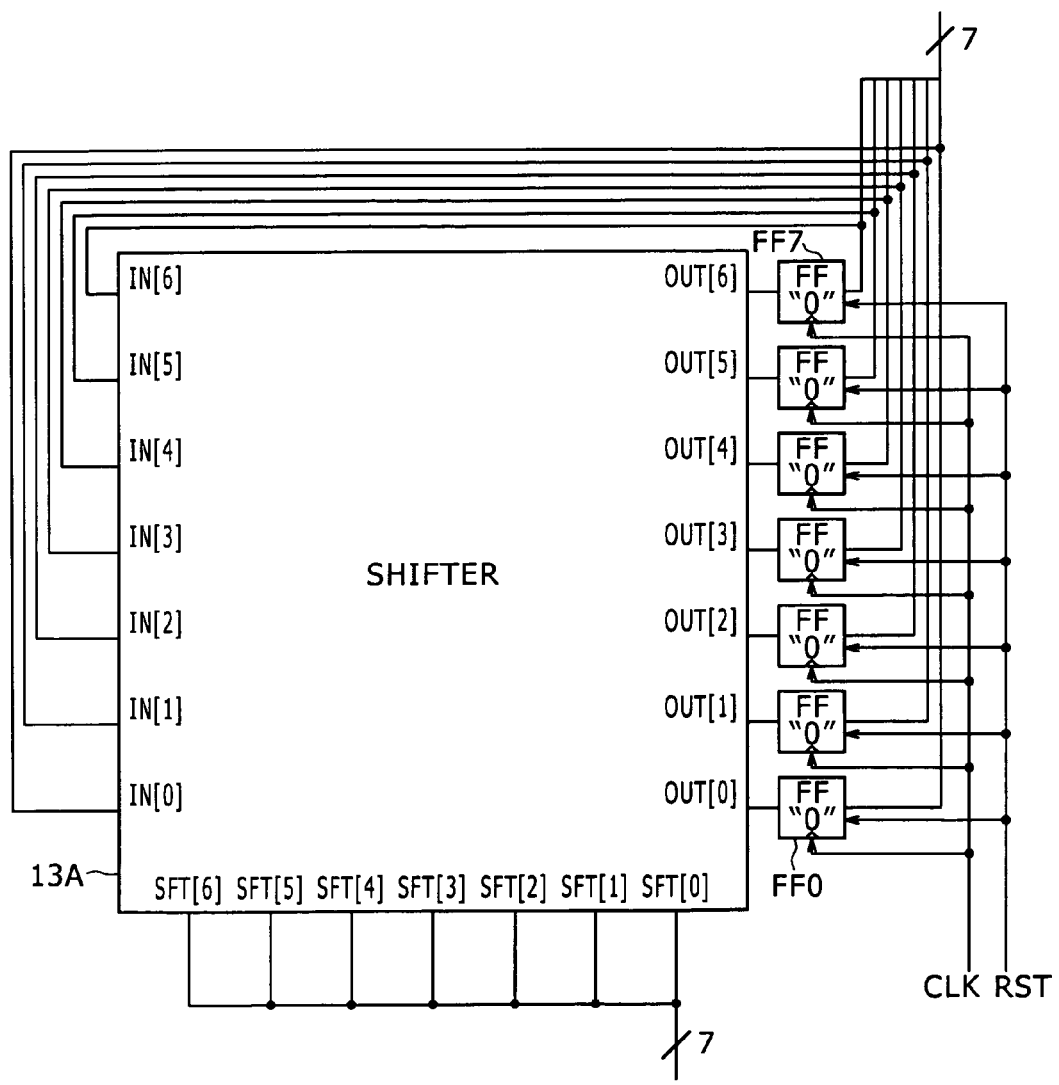
FIG. 16 is a schematic view showing a typical initial-state setup of flip-flop circuits constituting a second register in the second embodiment.

The second embodiment has its flip-flops set as shown in FIG. 16 in the initial state so as to implement the code circulating through the loop circuit constituted by the first shifter circuit 13 and second register 14 in the first embodiment (i.e., the code having only one of its bits set to "1"). That is, the flip-flop circuits FF0 through FF6 making up the second register 14A connected to the first shifter circuit 13A as part of the loop in FIG. 12 are set to "1000000" in the initial state, as illustrated in FIG. 16.

In the example of FIG. 16, only the flip-flop circuit FF0 corresponding to LSB is set to "1" by a reset signal RST in the initial state. The same operation can be implemented even if a flip-flop circuit other than that of LSB is set to "1" in the initial state as discussed above.

The second embodiment thus offers the following benefits: With no need for adders, there is no critical path that would hamper rapid operations such as carries, whereby high-speed performance is provided. Since latency is approximately the same for the signal paths effecting add operations, timing design is very easy to accomplish. Because the circuit structure is made very simple, the scale of circuitry may be reduced and the amount of power dissipation lowered correspondingly.

The above-described linearity enhancement circuits 10 and 10A may be applied illustratively to ΣΔ A/D converters.

3. Third Embodiment

Figure 17:
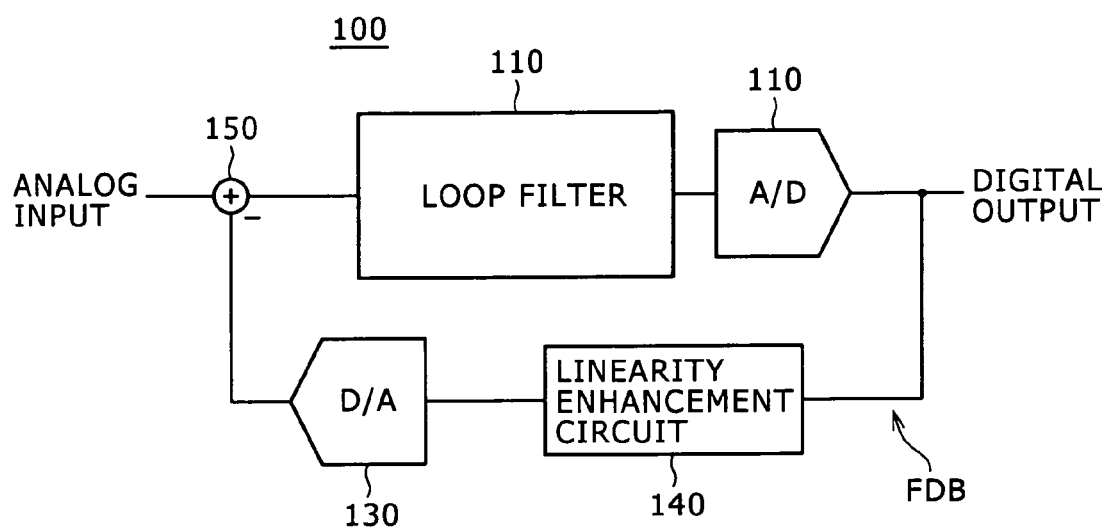
FIG. 17 is a block diagram showing a typical structure of a ΣΔ A/D converter implemented as a third embodiment of the present invention.

FIG. 17 is a block diagram showing a typical structure of a ΣΔ A/D converter 100 implemented as the third embodiment of the present invention. The ΣΔ A/D converter 100 is made up of a filter block 110, an n-bit A/D converter 120 of low resolution (e.g., 1 to 5 bits), a D/A converter 130 having the same number of bits as the A/D converter, a linearity enhancement circuit 140, and a subtractor 150 in the input stage. Being a feedback-based system, the ΣΔ A/D converter 100 reduces the nonlinearity and noise of the circuit and thereby provides high resolution.

The A/D converter 120 corresponds to the A/D converter 20 in FIGS. 5 and 12, and the D/A converter 130 corresponds to the D/A converter 30 also in FIGS. 5 and 12. In a feedback loop FDB, the linearity enhancement circuit 10 or 10A in FIG. 5 or 12 is adopted as the linearity enhancement circuit 140 connected interposingly between the output of the A/D converter 120 and the input of the D/A converter 130.

The filter block 110 filters an analog signal supplied by the subtractor 150, and outputs the filtered analog signal to the A/D converter 120. The A/D converter 120 converts the output signal of the filter block 110 into a digital signal, and outputs the resulting digital signal to the outside as well as to the linearity enhancement circuit 140 disposed in the feedback loop FDB.

The D/A converter 130 converts to an analog signal the digital signal coming from the linearity enhancement circuit 140 in the feedback loop FDB, and outputs the resulting analog signal to the subtractor 150. The subtractor 150 subtracts the output signal of the D/A converter 130 from the input analog signal, and feeds the resulting analog signal to the filter block 110.

Even where the A/D converter 120 with a bit count other than 1 bit is utilized, the ΣΔ A/D converter 100 of the third embodiment sufficiently guarantees the linearity of the D/A converter whose nonlinearity can be a factor contributing to raising the noise floor. This ΣΔ A/D converter 100 may be applied advantageously to the reception apparatus for receiving TV broadcast signals.

4. Fourth Embodiment

Figure 18:
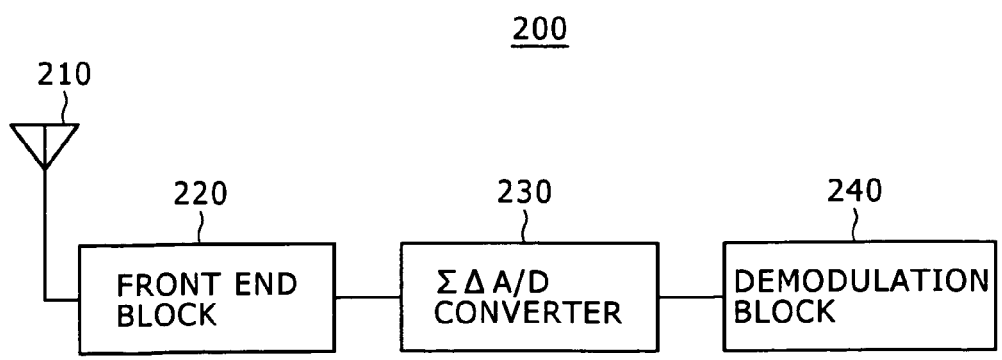
FIG. 18 is a block diagram showing a typical structure of a reception apparatus implemented as a fourth embodiment of the present invention.

FIG. 18 is a block diagram showing a typical structure of a reception apparatus 200 implemented as the fourth embodiment of the present invention. The reception apparatus 200 is constituted by an antenna 210, a front end block 220, a ΣΔ A/D converter 230, and a demodulation block 240. The ΣΔ A/D converter 100 shown in FIG. 18 is adopted as the ΣΔ A/D converter 230.

In the reception apparatus 200, a TV broadcast signal received by the antenna 210 is forwarded to the front end block 220. In the front end block 220, unnecessary components are removed from the signal which is then amplified by a low-noise amplifier. Following the amplification, an intermediate frequency signal is extracted from the signal by a mixer based on an oscillation signal generated by a local oscillator. The analog signal coming out of the front end block 220 is converted to a digital signal by the ΣΔ A/D converter 230, and the resulting digital signal is supplied to the demodulation block 240. The demodulation block 240 demodulates the received signal into video and audio signals which are then output to a display section or a recording section, not shown.

As one of its major advantages, the above-described reception apparatus 200 of the fourth embodiment allows digital broadcast signals to be acquired with precision.

The present application contains subject matter related to that disclosed in Japanese Priority Patent Application JP 2009-177477 filed in the Japan Patent Office on Jul. 30, 2009, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. A linearity enhancement circuit comprising:
   a first shift amount creation block configured to create a first shift amount in keeping with the immediately preceding output code of an n-bit analog/digital converter;
   a first shifter circuit configured to bit-shift input code data by said first shift amount that has been supplied, said first shifter circuit further outputting the bit-shifted input code data;
   a register configured to store the output of said first shifter circuit in order to output the stored data as said input code data to said first shifter circuit thereby forming a loop circuit in conjunction with said first shifter circuit, said register further outputting the stored code data as a second shift amount; and
   a second shifter circuit configured to bit-shift the output code of said analog/digital converter by said second shift amount that has been supplied, said second shifter circuit further outputting the bit-shifted output code to an n-bit digital/analog converter.

2. The linearity enhancement circuit according to claim 1, wherein said register stores ($2^n-1$)-bit code data, only one bit of said ($2^n-1$)-bit code data being set to "1" in an initial state.

3. The linearity enhancement circuit according to claim 1, wherein each of said first shifter circuit and said second shifter circuit bit-shifts the code data by the supplied shift amount in the direction from the least significant bit to the most significant bit, the bit shift being cycled back to the least significant bit if the most significant bit is exceeded.

4. The linearity enhancement circuit according to claim 1, further comprising a second shift amount creation block configured to convert to a decimal number the output code of said register as said second shift amount;
   wherein only one bit in said output code of said register is set to "1";
   said first shift amount creation block sets the bit shift amount to zero if the output code of said analog/digital converter is maximum, said first shift amount creation block further converting to a decimal number the output code of said analog/digital converter if said output code is other than maximum, said decimal number being output to said first shifter circuit as said first shift amount; and said second shift amount creation block converts the code to a value ranging from 0 to $(2^n-2)$ in keeping with the "1" set bit in the output code of said register.

5. The linearity enhancement circuit according to claim 1, wherein only one bit in said output code of said register is set to "1";

said first shift amount creation block outputs to said first shifter circuit a $(2^n-1)$-bit shift signal which indicates said first shift amount and in which only one bit is set to "1" in keeping with the output code of said analog/digital converter;

said first shifter circuit has the shift amount thereof designated by the bit set to "1" in said shift signal; and said second shifter circuit has the shift amount thereof designated by the bit set to "1" in the output code of said register.

6. The linearity enhancement circuit according to claim 1, further comprising an input register configured to store the immediately preceding output code of said analog/digital converter, said input register further outputting the stored code to said first shift amount creation block.

7. A $\Sigma\Delta$ analog/digital converter comprising:

a filter block configured to filter a supplied analog signal;

an n-bit analog/digital converter configured to convert the output signal of said filter block to a digital signal;

an n-bit digital/analog converter configured to convert the digital signal to an analog signal in a feedback loop of said analog/digital converter;

a linearity enhancement circuit configured to be connected interposingly between the output of said analog/digital converter and the input of said digital/analog converter in said feedback loop, said linearity enhancement circuit further enhancing the linearity of said digital/analog converter; and a subtractor configured to subtract the output signal of said digital/analog converter from an input analog signal, said subtractor further supplying the resulting analog signal to said filter block;

wherein said linearity enhancement circuit includes a first shift amount creation block configured to create a first shift amount in keeping with the immediately preceding output code of said analog/digital converter;

a first shifter circuit configured to bit-shift input code data by said first shift amount that has been supplied, said first shifter circuit further outputting the bit-shifted input code data;

a register configured to store the output of said first shifter circuit in order to output the stored data as said input code data to said first shifter circuit thereby forming a loop circuit in conjunction with said first shifter circuit, said register further outputting the stored code data as a second shift amount; and a second shifter circuit configured to bit-shift the output code of said analog/digital converter by said second shift amount that has been supplied, said second shifter circuit further outputting the bit-shifted output code to said digital/analog converter.

8. A reception apparatus comprising:

a front end block configured to extract a received signal;

a $\Sigma\Delta$ analog/digital converter configured to convert to a digital signal the signal in analog form coming from said front end block; and a demodulation block configured to demodulate the output digital signal from said $\Sigma\Delta$ analog/digital converter;

wherein said $\Sigma\Delta$ analog/digital converter includes a filter block configured to filter a supplied analog signal;

an n-bit analog/digital converter configured to convert the output signal of said filter block to a digital signal;

an n-bit digital/analog converter configured to convert the digital signal to an analog signal in a feedback loop of said analog/digital converter;

a linearity enhancement circuit configured to be connected interposingly between the output of said analog/digital converter and the input of said digital/analog converter in said feedback loop, said linearity enhancement circuit further enhancing the linearity of said digital/analog converter; and a subtractor configured to subtract the output signal of said digital/analog converter from an input analog signal, said subtractor further supplying the resulting analog signal to said filter block;

said linearity enhancement circuit includes a first shift amount creation block configured to create a first shift amount in keeping with the immediately preceding output code of said analog/digital converter;

a first shifter circuit configured to bit-shift input code data by said first shift amount that has been supplied, said first shifter circuit further outputting the bit-shifted input code data;

a register configured to store the output of said first shifter circuit in order to output the stored data as said input code data to said first shifter circuit thereby forming a loop circuit in conjunction with said first shifter circuit, said register further outputting the stored code data as a second shift amount; and a second shifter circuit configured to bit-shift the output code of said analog/digital converter by said second shift amount that has been supplied, said second shifter circuit further outputting the bit-shifted output code to said digital/analog converter.

* * * * *